United States Patent [19]
Walker et al.

[11] Patent Number: 4,918,564
[45] Date of Patent: Apr. 17, 1990

[54] LOAD DRIVER WITH DELAYED TURN-OFF

[75] Inventors: Charles J. Walker, Round Lake Beach; Steve Dominguez, Elgin, both of Ill.

[73] Assignee: Motorola, Inc., Schaumburg, Ill.

[21] Appl. No.: 358,969

[22] Filed: May 30, 1989

[51] Int. Cl.$^4$ .............................................. H02H 3/08
[52] U.S. Cl. ........................................ 361/94; 361/98; 361/101
[58] Field of Search ................ 361/87, 93, 94, 98, 361/101, 187, 196, 198; 320/207 P, 298

[56] References Cited

U.S. PATENT DOCUMENTS

| | | | |
|---|---|---|---|
| 4,736,267 | 4/1988 | Karlmann et al. | 361/101 |
| 4,763,222 | 8/1988 | Heaston et al. | 361/195 |
| 4,771,357 | 9/1988 | Lorincz et al. | 361/87 |
| 4,787,007 | 11/1988 | Matsumura et al. | 361/98 |

Primary Examiner—Derek S. Jennings
Attorney, Agent, or Firm—John H. Moore

[57] ABSTRACT

A load driver circuit has an output transistor driving the load, with a protective circuit that, when enabled, turns off the output transistor to protect it from high current levels. A delay circuit, which responds to abnormal load conditions after the output transistor has been on for a brief interval, enables the protective circuit to cause turn-off of the output transistor.

4 Claims, 1 Drawing Sheet

LOAD DRIVER WITH DELAYED TURN-OFF

FIELD OF THE INVENTION

This invention is directed to the field of electronic drivers that supply power to a load by means of a solid state output transistor, and to circuits for turning off the output transistor in the event of a shorted load or other type of fault that could damage the output transistor.

BACKGROUND OF THE INVENTION

The problems solved by the present invention are best explained by reference to a conventional electronic driver circuit 10 as shown in FIG. 1. The illustrated driver has an output transistor 12 driving a load which, in this case, is a solenoid coil 14. Another transistor 16 is coupled between ground and the other end of the coil 14, with a zener diode 17 coupled between the collector of transistor 16 and ground. An input transistor 18 receives a positive going input pulse via a divider consisting of resistors 19 and 21. The input pulse turns the transistor 18 on, as well as turning on the transistors 12 and 16 (via another resistor 23), thereby permitting current to flow in the coil 14.

A protective transistor 20 is coupled to the transistor 12 to limit the maximum level of current that the transistor 12 may conduct. Also, the base of the transistor 20 is coupled via resistors 22 and 24 to the load 14. With this arrangement, a defect in the load, such as could result in a low potential at node 26, would allow increased base drive to the transistor 20 to turn it more fully on, resulting in the transistor 12 being turned fully off to protect it from damage due to excessively high currents.

A capacitor 28 is coupled to the junction between resistors 22 and 24 to prevent transient, low level signals (not true faults) from turning on the transistor 20, and also to prevent transistor 20 from turning on before transistor 12 turns on when transistor 18 receives an input pulse.

A problem with the illustrated driver can occur when the input transistor 18 needs to be turned on and off rapidly, Assume, for example, that the output transistor 12 has just been turned off, and that the voltage at node 26 is driven low by the normal flyback action of the coil 14. If the input transistor 18 is turned on before the low potential at node 26 has dissipated, the transistor 20 turns on hard because the low potential at node 26 provides base drive via the resistors 22 and 24. Consequently, the transistor 20 latches the output transistor 12 off when no real fault condition exists. This type of operation is clearly undesirable.

OBJECTS OF THE INVENTIONS

It is a general object of the invention to provide an electronic load driver with protective circuitry which overcomes the problems discussed above.

It is a more specific object of the invention to provide an electronic load driver that is protected from abnormal load conditions, that can be turned off and on rapidly irrespective of load conditions, and that does not require a large number of additional components as compared to conventional drivers.

DESCRIPTION OF THE PREFERRED EMBODIMENT

Figure 1:
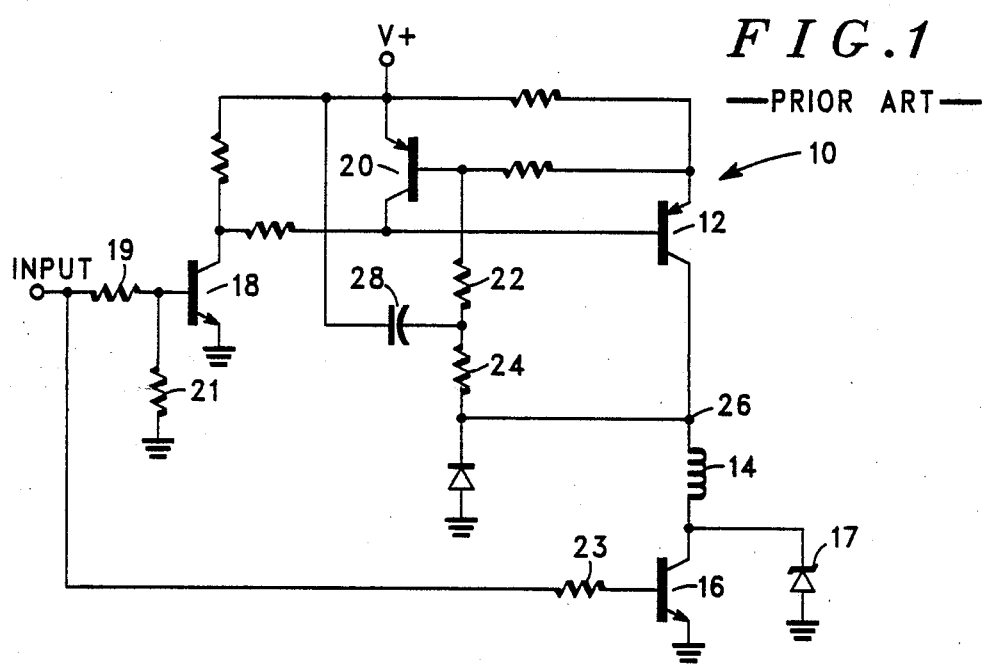
FIG. 1, previously described, is a schematic diagram of a conventional electronic load driver having current overload protection.
Figure 2:
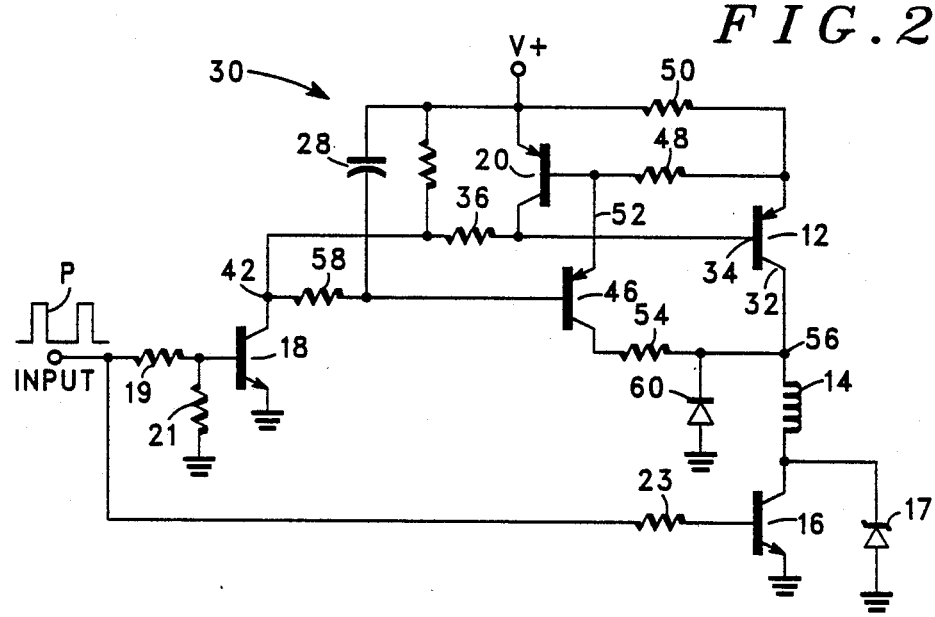
FIG. 2 is a schematic diagram of an electronic load driver in accordance with this invention.

Referring now to FIG. 2, there is shown a load driver circuit 30 according to the invention. Components of the circuit 30 and corresponding components in FIG. 1 have the same reference numerals.

As shown, the circuit 30 includes an output transistor 12 that is to be protected in accordance with the invention. This output transistor has an output terminal 32 that is connected to one end of a load 14 (which may be the coil of a solenoid), the other end of the load being connected to the collector of a transistor 16. A zener diode 17 is coupled between ground and the collector of transistor 16. An input terminal 34 of the output transistor 12 is coupled through a resistor 36 to the collector of an input transistor 18. The base of the input transistor 18 receives repetitive input pulses P via an input divider (resistors 19 and 21). With this arrangement, each input pulse P turns on the transistor 18, thereby providing negative going turn-on pulses at the collector (node 42) of the transistor 18 for repetitively turning on the output transistor 12 via the resistor 36. The transistor 16 is simultaneously being turned on by the input pulses P via a path that includes another resistor 23. Thus, a current path is established through the load 14 in response to each input pulse P.

Protection for the output transistor 12 is provided by a protective circuit that includes the transistor 20, and by a delay circuit that includes a transistor 46, a resistor 58 and a capacitor 28. As will be described more fully below, the delay circuit fully enables the transistor 12 when an abnormal load condition occurs so as to turn off the output transistor 12, but the timing of the turn-off is controlled so as to ignore transient conditions that are not true faults, and so as to permit the transistor 12 to be turned off and on rapidly by the pulses P, irrespective of the state of the load.

Turning first to the transistor 20, its base is coupled to the emitter of the transistor 12 via a resistor 48. Another resistor 50 is coupled between the V+ supply and the emitter of the transistor 12, and the emitter of the transistor 20 is connected to the V+ supply. The collector of the transistor 20 is coupled to the base of the transistor 12. This configuration causes the emitter current of the output transistor to flow through the resistor 50, and the voltage drop across the resistor 50 results in a bias being applied across the base-emitter junction of the transistor 20. When the emitter current of the transistor 12 reaches a preselected level, the transistor 20 turns on somewhat, thereby raising the potential at the base of the transistor 12 to limit the current therein. The net result of this operation is that the transistor 20 senses the current in the transistor 12 and limits that current to a preselected level. In this mode of operation, however, the transistor 20 does not turn off the transistor 12. It merely limits its current to a safe level.

Referring now to the transistor 46, its emitter is coupled via a lead 52 to the base of the transistor 20, its collector is coupled via a resistor 54 to the load 14 (at node 56), and its base is coupled to the capacitor 28 and to the node 42 via the resistor 58. A diode 60 is coupled between ground and one end of the load 14 to prevent the potential at the node 56 from being driven far below ground by the flyback operation of the load 14. With this arrangement, the transistor 46, the capacitor 28, and their associated resistors operate to enable (turn fully on) the transistor 20 whenever an abnormal load condition (such as a shorted load) is sensed at the node 56 and after the output transistor has been turned on for a brief, preselected interval.

The operation of the protective action is as follows. A negative-going turn-on pulse is generated at the node 42 is response to each input pulse P. The turn-on pulse immediately turns on the transistor 12, while the transistor 16 is turned on by the corresponding input pulse P. Current now flows through the load 14 and, given normal operating conditions, the load current will continue for the duration of the input pulse P.

When an input pulse P terminates and transistors 12 and 16 turn off, the potential at the node 56 may be driven low by the normal flyback operation of the load 14. It is significant that such a low potential at the node 56 does not prevent the transistor 12 from turning on again in response to the next input pulse P. Recall that the conventional circuit of FIG. 1 caused the transistor 20 to turn the transistor 12 off if the next input pulse arrived while the potential at the load was low. In the case of the circuit 30, the delay circuit permits the output transistor 12 to be turned on and off at a rapid rate, despite the effects of the load's flyback.

This advantage is obtained as follows. The resistor 58 and capacitor 28 operate to provide a delayed turn-on pulse at the base of the transistor 46. Consequently, the transistor 46 cannot turn on until after the output transistor 12 has been turned on by a non-delayed turn-on pulse. The amount of delay in turning on the transistor 46 is determined by the time constant associated with the capacitor 28 and resistor 58, and this delay may typically be about 100 microseconds. Thus, the transistor 46 acts as a switch that stays off, and prohibits the transistor 20 from turning fully on, for a brief interval following each turn-on pulse. During that interval, the low potential previously generated at the node 56 by the flyback action of the load can dissipate. When the transistor 46 is enabled after the delay interval, any low potential at the node 56 can be assumed to be caused by a fault, and the transistor 46 will deliver base drive to the transistor 20 to turn off the transistor 12.

Now consider the situation in which a fault in the load 14 causes the node 56 to be shorted to ground while the transistor 12 is already on and operating normally. If the delay associated with the capacitor 28 has already elapsed, the low potential at node 56 will cause the transistor 46 to conduct heavily, thereby providing base drive current to the transistor 20 via the lead 52. The transistor 20 immediately turns fully on, thereby turning off the transistor 12 and protecting it from destructive levels of current.

When the next input pulse P arrives, the transistor 12 will again be turned on, even though the node 56 is still shorted to ground because the delayed turn-on pulse will have decayed and the transistor 46 will be off. After the delay associated with the capacitor 28, the transistor 46 will turn on to enable the transistor 20 which will again turn off the transistor 12.

It can be seen, therefore, the transistor 12 is permitted to turn on for a brief interval in response to each turn-on pulse. If the load is in an abnormal condition which pulls the potential at node 56 low, the transistor 46 is turned on by the delayed turn-on pulse to initiate turn-off of the transistor 12.

An advantage associated with the illustrated embodiment is that a transient condition which causes the potential at node 56 to go low will not latch the output transistor 12 is an off condition. While such a transient (if it lasts longer than the delay provided by the capacitor 28) may result in the transistor 12 being turned off, the next turn-on pulse will again turn the transistor 12 on. If the transient condition has disappeared, the transistor 12 will remain on.

Another previously mentioned advantage is that the low potential normally generated at the node 56 by the flyback operation of the load 14 will not cause the transistor 12 to turn off if the next input pulse P arrives before the effect of the flyback has dissipated. The transistor 46 will isolate the low potential on node 56 from the the transistor 20 until a delayed turn-on pulse arrives, thereby permitting normal operation of the circuit even with a relatively rapid repetition rate for the input pulses.

Although the invention has been described in terms of a preferred embodiment, it will be obvious to those skilled in the art that many alterations and variations may be made without departing from the invention. Accordingly, it is intended that all such alterations and variations be considered as within the spirit and scope of the invention as defined by the appended claims.

What is claimed is:

1. A load driver circuit, comprising:
   an output transistor having an input terminal and an output terminal;
   a load connected to the output terminal of the output transistor;
   means for repetitively turning the output transistor on;
   a protective circuit coupled to the output transistor for sensing and limiting the current in the output transistor to a safe level, and for turning the output transistor off in response to a fault sense signal; and
   a delay circuit coupled to the load and to the protective circuit; and responsive to abnormal load conditions for applying a fault sense signal to the protective circuit after the output transistor has been turned on for a brief, preselected interval, thereby permitting the protective circuit to turn off the output transistor.

2. A load driver circuit as set forth in claim 1 wherein the protective circuit includes a first transistor which, when enabled, turns off the output transistor, and wherein the delay circuit includes switch means that provides a path for base current to enable the first transistor, and wherein the switch means is held open for said brief, preselected interval to thereby prevent the first transistor from being enabled during the same interval.

3. A load driver as set forth in claim 2 wherein the means for turning on the output transistor applies repetitive turn-on pulses to the output transistor, wherein the switch means comprises a second transistor providing a path for base current between the load and the first transistor, and the delay circuit includes means for delaying each turn-on pulse to provide delayed turn-on pulses, and means for applying the delayed turn-on pulses to the second transistor to turn-it on.

4. A load driver circuit, comprising:

an output transistor having an input terminal and an output terminal;
a load connected to the output terminal of the output transistor;
means for applying repetitive turn-on pulses to the input terminal of the output transistor;
a first transistor coupled to the output transistor so as to sense and limit the current in the output transistor and, when the first transistor is fully enabled, to turn the output transistor off;
a capacitive network receiving the turn-on pulses and providing delayed turn-on pulses; and
a second transistor receiving the delayed turn-on pulses and being coupled between the first transistor and the load so as to turn on when the potential at the load is abnormally low and so as to thereby fully enable the first transistor for turning off the output transistor.

* * * * *